(12) United States Patent
Meinerzhagen et al.

(10) Patent No.: US 9,230,636 B2
(45) Date of Patent: Jan. 5, 2016

(54) APPARATUS FOR DUAL PURPOSE CHARGE PUMP

(71) Applicants: Pascal A. Meinerzhagen, Lausanne (CH); Jaydeep P. Kulkarni, Portland, OR (US); Muhammad M. Khellah, Tigard, OR (US); Cyrille Dray, Hillsboro, OR (US); Dinesh Somasekhar, Portland, OR (US); James W. Tschanz, Portland, OR (US); Vivek K. De, Beaverton, OR (US)

(72) Inventors: Pascal A. Meinerzhagen, Lausanne (CH); Jaydeep P. Kulkarni, Portland, OR (US); Muhammad M. Khellah, Tigard, OR (US); Cyrille Dray, Hillsboro, OR (US); Dinesh Somasekhar, Portland, OR (US); James W. Tschanz, Portland, OR (US); Vivek K. De, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 84 days.

(21) Appl. No.: 14/137,808

(22) Filed: Dec. 20, 2013

(65) Prior Publication Data

US 2015/0179247 A1 Jun. 25, 2015

(51) Int. Cl.
| | | |
|---|---|---|
| *G11C 5/14* | (2006.01) | |
| *G11C 11/4074* | (2006.01) | |
| *G11C 11/16* | (2006.01) | |
| *G11C 16/06* | (2006.01) | |
| *G11C 11/406* | (2006.01) | |
| *G11C 11/4076* | (2006.01) | |
| *G11C 5/06* | (2006.01) | |
| *G11C 11/408* | (2006.01) | |

(52) U.S. Cl.
CPC ........ *G11C 11/4074* (2013.01); *G11C 11/1697* (2013.01); *G11C 11/406* (2013.01); *G11C 11/4076* (2013.01); *G11C 16/06* (2013.01); *G11C 5/063* (2013.01); *G11C 5/14* (2013.01); *G11C 11/4085* (2013.01); *G11C 11/4087* (2013.01)

(58) Field of Classification Search
CPC .......... G11C 16/06; G11C 5/14; G11C 16/12; G11C 16/30; G11C 5/147; G11C 2211/4067; G11C 5/063
USPC ...................... 365/226, 229, 230.05
See application file for complete search history.

(56) References Cited

U.S. PATENT DOCUMENTS

2014/0181279 A1* 6/2014 Louis et al. ................... 709/222
2014/0369125 A1* 12/2014 Della Mina et al. ..... 365/185.12

* cited by examiner

*Primary Examiner* — Fernando Hidalgo
(74) *Attorney, Agent, or Firm* — Blakely, Sokoloff, Taylor & Zafman LLP (57) ABSTRACT

Described is an apparatus which comprises: a first power supply node to provide a first power supply, a second power supply node, and a third power supply node; a first transistor which is operable to couple the first and second power supply nodes; and a charge pump circuit to provide a boosted voltage to the third power supply node in one mode, and to recover charge from the second power node in another mode. Described is a memory unit which comprises: a DRAM which is operable to be refreshed; a gated power supply node coupled to the DRAM to provide a gated power supply to the DRAM; and a charge recycling circuit to recover charge from the gated power supply node after the DRAM is refreshed.

19 Claims, 8 Drawing Sheets

APPARATUS FOR DUAL PURPOSE CHARGE PUMP

BACKGROUND

Power-gating (e.g., Sleep-mode) is a popular technique to reduce power consumption of circuit blocks. During power-gating, inactive circuit blocks are disconnected from their power supply to minimize leakage currents. In conventional power-gating schemes, electric charge residing on the capacitive power distribution network is lost through leakage currents of the power-gated circuit blocks.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Embedded memories consume an increasingly dominant active and leakage power share of microprocessors in particular and VLSI Systems-on-Chip (SoC) in general. In order to meet tight power budgets while allowing for easy integration of circuits, it is preferential to scale the supply voltage of the embedded memories along with the supply voltage of logic circuit blocks.

6-transistor (6T)-bit-cell static random-access memory (SRAM) is the mainstream solution for implementing embedded memories, and a large variety of alternative bit-cells, including 8-transistor (8T) and 10-transistor (10T) bit-cells may achieve robust low voltage operation by decoupling and separately optimizing the read and write ports. In addition, the supply voltage VccMin, which is the minimum operating supply voltage, for reliable read and write operations can be further decreased by using read and write assist techniques.

For example, voltage boosting may be used for a small amount of critical circuit nodes—namely, the write word lines (WWLs) and the read word lines (RWLs)—in an 8T-bit-cell SRAM array by using a charge pump (CP) which is integrated with the SRAM bit-cell. The voltage boosting of critical nodes allows for a reduction of the main supply voltage VccMin and leads to lower active and leakage power consumption (relative to a baseline design without WWL and RWL boosting).

In many application scenarios, minimizing the leakage power of embedded memories during standby is an equally or even more relevant concern than reducing active power. To enable an energy-efficient and reliable data retention mode, the supply voltage of SRAM arrays can be scaled to values below VccMin. Voltage below VccMin i.e., Vhold, can be used for reliable data retention. Vhold is defined by the retention noise margin (RNM) and is normally lower than VccMin.

Some embodiments describe apparatus for reusing the readily available CP (which was originally introduced to achieve low VccMin) to enable a more energy-efficient retention mode by recovering charge during each active-to-sleep transition. In one embodiment, charge recovery (CR) is performed by reusing the existing CP. In one embodiment, the CR mechanism for both retentive and destructive sleep modes is achieved at a very small area overhead. For example, one or two additional switches are added to the original architecture along with making the CP operable in CR mode.

In one embodiment, in retentive sleep mode, the CP is used to recover charge from the non-retentive power distribution network of the peripheral circuits. In one embodiment, in destructive sleep mode, the CP is used to recover charge from the power distribution networks of both the peripherals and the bit-cell array. In one embodiment, the recovered charge is returned to the global power line of the SoC or is directly supplied to the SRAM bit-cells to supply their current need for a given amount of time.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information/current flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct electrical connection between the things that are connected, without any intermediary devices. The term "coupled" means either a direct electrical connection between the things that are connected or an indirect connection through one or more passive or active intermediary devices. The term "circuit" means one or more passive and/or active components that are arranged to cooperate with one another to provide a desired function. The term "signal" means at least one current signal, voltage signal or data/clock signal. The meaning of "a," "an," and "the" include plural references. The meaning of "in" includes "in" and "on."

The term "scaling" generally refers to converting a design (schematic and layout) from one process technology to another process technology. The term "scaling" generally also refers to downsizing layout and devices within the same technology node. The term "scaling" may also refer to adjusting (e.g., slow down) of a signal frequency relative to another parameter, for example, power supply level. The terms "substantially," "close," "approximately," "near," and "about," generally refer to being within +/−20% of a target value.

Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For purposes of the embodiments, the transistors are metal oxide semiconductor (MOS) transistors, which include drain, source, gate, and bulk terminals. The transistors also include Tri-Gate and FinFET transistors, Gate All Around Cylindrical Transistors or other devices implementing transistor functionality like carbon nano tubes or spintronic devices. Source and drain terminals may be identical terminals and are interchangeably used herein. Those skilled in the art will appreciate that other transistors, for example, Bi-polar junction transistors—BJT PNP/NPN, BiCMOS, CMOS, eFET, etc., may be used without departing from the scope of the disclosure. The term "MN" indicates an n-type transistor (e.g., NMOS, NPN BJT, etc.) and the term "MP" indicates a p-type transistor (e.g., PMOS, PNP BJT, etc.).

Figure 1:
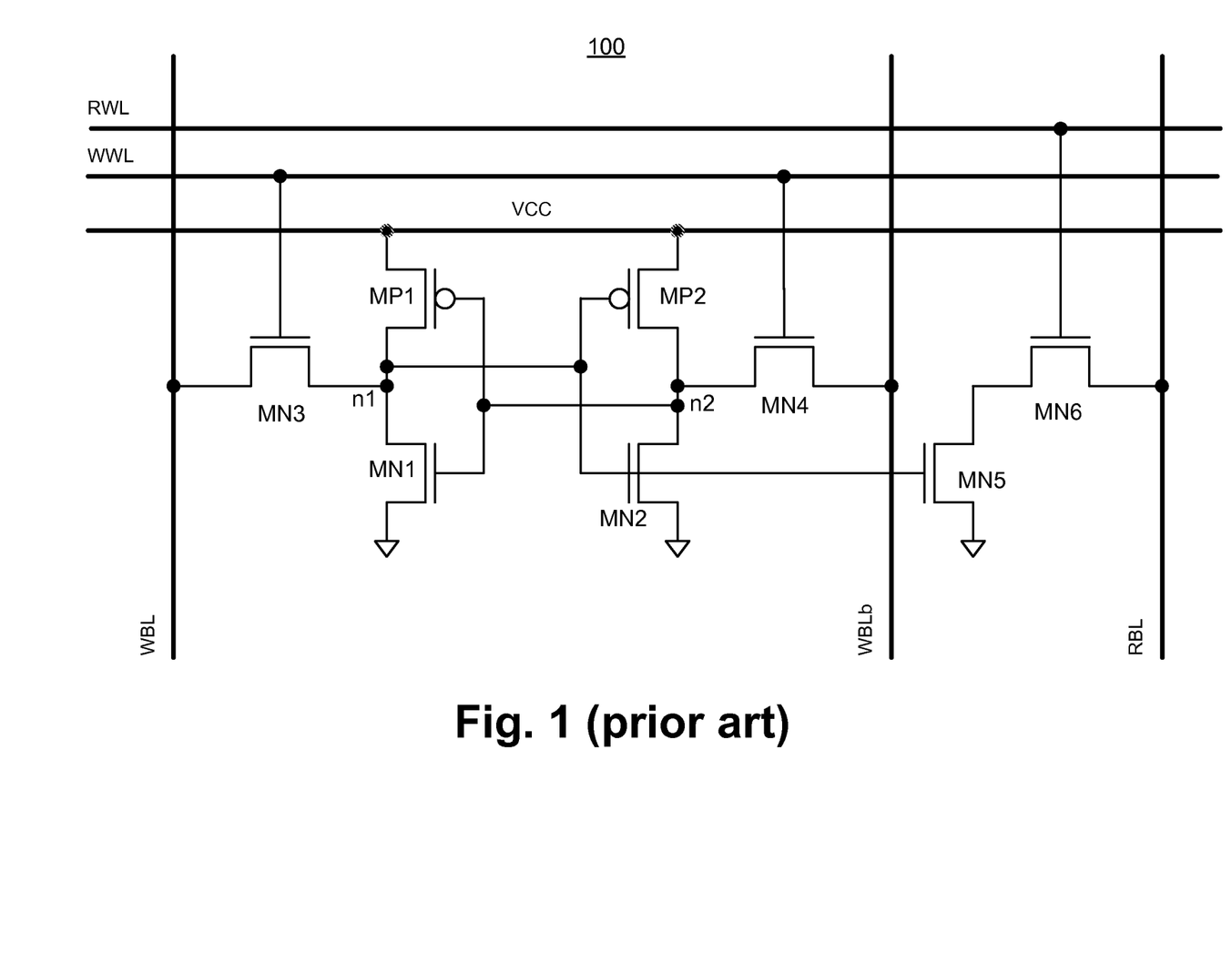
FIG. 1 illustrates an 8-transistor (8T) bit-cell used in low VccMin SRAM bit-cell.

FIG. 1 illustrates an 8-transistor (8T) bit-cell 100 used in low VccMin SRAM macrocells. Here, the 8T SRAM bit-cell 100 consists of a conventional 6T SRAM bit-cell which is extended by a read buffer to decouple read and write operations. The 6T SRAM bit-cell includes n-type transistors MN1, MN2, MN3, and MN4; and p-type transistors MP1 and MP2 coupled together as shown. The read buffer includes n-type transistors MN5 and MN6 coupled together with the 6T SRAM bit-cell as shown.

Here, RWL (read wordline) is coupled to the gate terminal of MN6. WWL (write word line) is coupled to the gate terminals of access devices MN3 and MN4 of the 6T SRAM bit-cell. WBL (write bit-line) is coupled to the access device MN3. WBLb (which is an inverse of WBL) is coupled to the access device MN4. RBL (read bit line) is coupled to MN6. Power supply is provided by VCC line.

By extending the 6T SRAM bit-cell by a read buffer to decouple read and write operations, the transistors in the 6T part of the bit-cell can be sized for improved write-ability (i.e., low write failure probability) while not affecting the read-ability of the bit-cell, as the read operation is performed by a dedicated and separately optimized read buffer.

Bit-cell design 100 allows for a significant reduction of VccMin compared to the conventional 6T bit-cell. Here, VccMin can be further reduced by boosting the selected WWL and RWL to a value close to 2×VCC during write and read operations, respectively. To this end, the switched-capacitor, a charge pump (CP) may be used. This CP is designed to provide a sufficiently high output voltage (e.g., close to 2×VCC) for the output load current consumed by the WWL and RWL drivers and the corresponding VCC-to-VCCboost level shifters (LS). During a retentive sleep mode, the two cross-coupled inverters in the 6T part of the bit-cell are supplied with current to ensure data retention.

Figure 2:
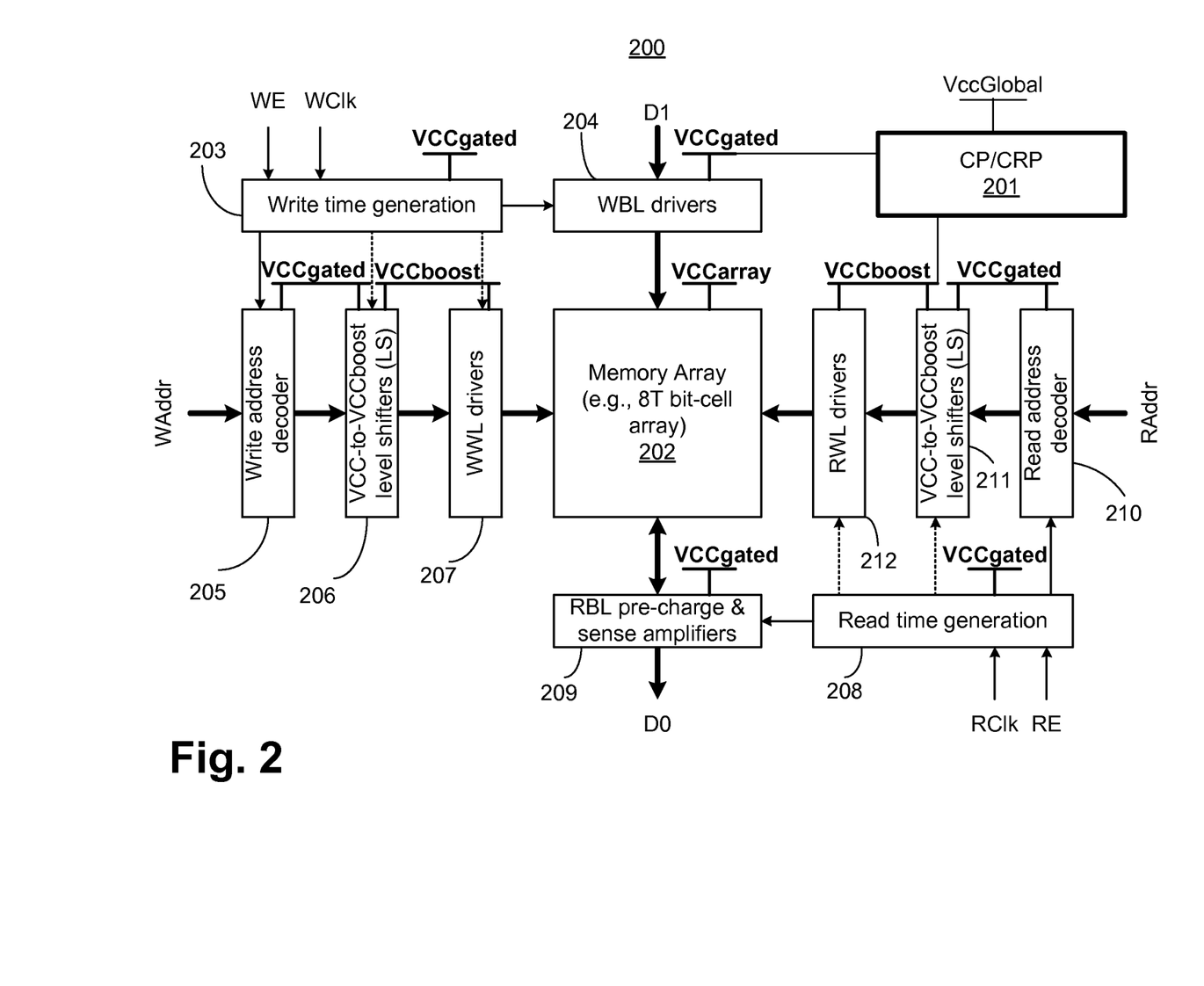
FIG. 2 illustrates memory architecture with charge recovery pump (CRP) circuit, according to one embodiment of the disclosure.

FIG. 2 illustrates memory architecture 200 with charge pump recovery (CRP) circuit, according to one embodiment of the disclosure. In one embodiment, memory architecture 200 comprises dual-purpose Charge Pump (CP) 201 (i.e., charge pump used for boosting voltage and for recovering charge (CP/CRP)), Memory Array 202 (e.g., 6T SRAM, 8T register file (RF) or SRAM), Write Time Generator 203, WBL drivers 204, Write Address Decoder 205, VCC-to-VCCboost level-shifters (LS) 206, WWL Drivers 207, RBL Read Time Generator 208, Pre-Charge and Sense Amplifiers 209, Read Address Decoder 210, VCC-to-VCCboost LS 211, and RWL Drivers 212.

The following embodiment is described with reference to an 8T bit-cell Memory Array 202. However, the embodiments may be used with any architecture where charge is stored on a capacitive node during one mode of operation and which tends to discharge from the capacitive node in another mode of operation. CP/CRP 201 is used to recover charge during the other mode so that the recovered charge may be used by another active circuit or simply stored for reserve power capacity.

In one embodiment, for writing data to Memory Array 202, Write Time Generator 203 receives Write Enable (WE) and Write Clock (WClk) signals and generates control signals for Write Address Decoder 205, VCC-to-VCCboost LS 206, WWL Divers 207, and WBL Drivers 204. In one embodiment, WBL drivers 204 receive data D1 and provide it to Memory Array 202 for storage. In one embodiment, Write Address Decoder 205 receives Write Address (WAddr). In one embodiment, output of Write Address Decoder 205 is provided to WWL drivers 207 via VCC-to-VCCboost LS 206. The WWL drivers 207 then drive the WAddr to Memory Array 202.

In one embodiment, for reading data from Memory Array 202, Read Time Generator 208 receives Read Enable (RE) and Read Clock (RClk) signals and generates control signals for Read Address Decoder 210, VCC-to-VCCboost LS 211, RWL Divers 212, and RBL pre-charge and sense amplifiers 209. In one embodiment, RBL pre-charge and sense amplifiers 209 receives data D0 from Memory Array 202. In one embodiment, Read Address Decoder 210 receives Read Address (RAddr). In one embodiment, output of Read Address Decoder 210 is provided to RWL drivers 212 via VCC-to-VCCboost LS 211. RWL drivers 210 then drive the RAddr to Memory Array 202 so that Data D0 can be read out.

In one embodiment, architecture 200 has separate write and read ports, which allows architecture 200 to be implemented as a two-port memory (i.e., a memory exhibiting a separate read and write port) with a low area overhead compared to a single-port implementation. As the access speed and the memory bandwidth suffer under voltage scaling all the way to VccMin, the two-port memory implementation of architecture 200 improves memory bandwidth.

In one embodiment, Memory Array 202 is steadily supplied from VCCarray (which can be, for example, equal to VCC or Vhold) as long as data retention is required. In one embodiment, VCCarray can be power-gated during destructive sleep modes. In one embodiment, WWL and RWL drivers (207 and 212), as well as the corresponding VCC-to-VCCboost LSs 206 and 211, are supplied from a boosted supply (VCCboost) during write and read operation, at least for operation at or close to VccMin. In one embodiment, VCCboost is generated by CP/CRP 201.

For operating at high VCC (e.g., at or close to nominal VCC), in one embodiment, CP/CRP 201 is disabled and VCCboost is shorted to VCC to avoid Vmax (i.e., process sanctioned break down voltage) violations. In one embodiment, all remaining blocks (i.e., peripheral blocks) of memory architecture 200 receive a full VCC during write and read, but can be power gated during sleep modes without affecting data integrity in the array. In such an embodiment, these blocks are supplied from a gated supply (VCCgated).

In one embodiment, when memory architecture 200 enters a low power mode e.g., Sleep mode then CP/CRP 201 recovers charge from VCCgated power supply node and provides that charge to the global VCC node or any other reserve storage node. Here, Sleep mode may be retentive (i.e., retentive mode) in which power supply to Memory Array 202 is lowered to a retention level. When Sleep mode is destructive (i.e., destructive mode) then power supply to Memory Array 202 may be reduced to ground i.e., data in Memory Array 202 can be lost. In one embodiment, during Sleep destructive mode, CP/CRP 201 recovers charge from VCCgated power supply node and VCCarray power supply node. In one embodiment, during Sleep mode, CP/CRP 201 recovers charge from VCCboost power supply node along with other power supply nodes.

Figure 3:
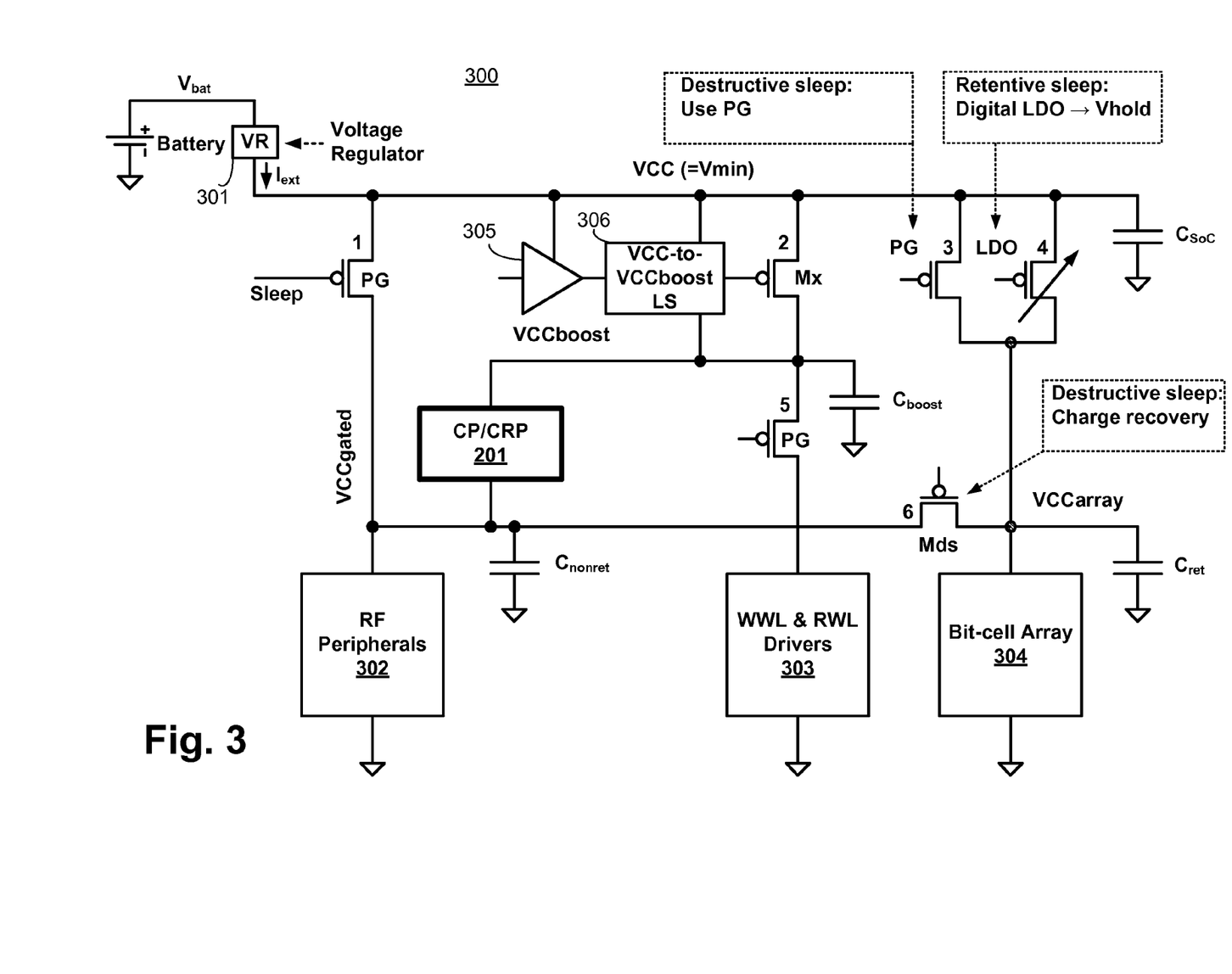
FIG. 3 illustrates a power delivery network with CRP circuit for use in a volatile memory system, according to one embodiment of the disclosure.

FIG. 3 illustrates a power delivery network 300 with CRP circuit for use in a volatile memory system, according to one embodiment of the disclosure. It is pointed out that those elements of FIG. 3 having the same reference numbers (or names) as the elements of any other figure can operate or function in any manner similar to that described, but are not limited to such.

In one embodiment, power delivery network 300 comprises Voltage Regulator (VR) 301, input supply source (e.g., Battery), CP/CRP 201, RF peripherals 302, WWL and RWL drivers 303, Bit-cell Array 204, buffer 305, VCC-to-VCCboost LS 306, p-type devices PG-1 (i.e., power gate), Mx-2, PG-3, LDO-4 (Low Dropout regulator transistor), PG-5, and Mds-6 coupled together as shown. Here, PG-1 is also referred as the first transistor, Mx-2 as the second transistor, PG-3 as the third transistor, LDO-4 as the fourth transistor, PG-5 as the fifth transistor, and Mds as the sixth transistor.

While the power delivery network 300 is described with reference to a register file (RF), the same concept of charge recovery, using the apparatus described with reference to power delivery network 300, can be used for any architecture that transitions between low power mode and high power active mode.

In one embodiment, VR 301 is an on-die VR. In another embodiment, VR 301 is an off-die VR. In one embodiment, output of VR is coupled to a first power supply node VCC. In one embodiment, $V_{bat}$ from the Battery is provided as input power supply to VR which generates a regulated first power supply VCC (also referred to as Global Vcc) and current $I_{ext}$. Here, label for signal or power supply and node is interchangeably used. For example, first power supply VCC may refer to first power supply node VCC or first power supply VCC depending on the context of the sentence. In one embodiment, a decoupling capacitor $C_{SoC}$ is coupled to the first power supply node and ground (Vss). In one embodiment, first power supply node (VCC) is coupled to buffer 305, VCC-to-VCCboost LS 306, PG-1, Mx-2, PG-3, and LDO-4.

In one embodiment, PG-1 is coupled to the first power supply node (VCC) and to a second power supply node (VCCgated). In one embodiment, PG-1 is controllable by Sleep signal. In one embodiment, a decoupling capacitor $C_{nonret}$ is coupled to second power supply node (VCCgated) and ground. In one embodiment, second power supply node (VCCgated) is coupled to RF Peripherals 302, CP/CRP 201, and Mds-6 device.

In one embodiment, third power supply node (VCCboost) is coupled to VCC-to-VCCboost LS 306, CP/CRP 201, Mx-2 and PG-5. In one embodiment, a decoupling capacitor $C_{boost}$ is coupled to third power supply node (VCCboost) and ground. In one embodiment, gate terminal of Mx-2 is controlled by output of VCC-to-VCCboost LS 306. In one embodiment, PG-5 is turned ON during active or normal mode.

In one embodiment, PG-3 is coupled to first power supply node (VCC) and fourth power supply node (VCCarray). In one embodiment, LDO-4 is coupled to first power supply node (VCC) and fourth power supply node (VCCarray). In one embodiment, PG-3 is turned OFF during destructive sleep mode. In one embodiment, LDO-4 is turned ON during retentive sleep mode. In one embodiment, LDO-4 is controllable by a digital bus. In one embodiment, strength of LDO-4 can be adjusted to adjust the voltage level of VCCarray. For example, LDO-4 can be used to provide Vhold voltage level to VCCarray. In one embodiment, a decoupling capacitor $C_{ret}$ is coupled to fourth power supply node (VCCarray) and ground (Vss). In one embodiment, fourth power supply node (VCCarray) is coupled to Mds-6 and Bit-cell Array 304 (same as 202). In one embodiment, Mds-6 is turned ON during destructive sleep mode OR during the active mode otherwise it is turned OFF.

In one embodiment, peripheral circuits (e.g., RF Peripherals 302), as well as the input of CP/CRP 201, are supplied from the second power supply node (VCCgated) which can be power-gated with the power gate switch PG-1 upon entering a sleep mode. In one embodiment, CP/CRP 201 generates boosted power supply (VCCboost). In one embodiment, Bit-cell Array 304 is steadily supplied with first power supply VCC (e.g., VccMin) by turning ON PG-3 and/or the LDO-4 (also called clamp-4) during retentive sleep mode.

In such an embodiment, when VccMin is slightly higher than Vhold, energy is saved. In one embodiment, Bit-cell Array 304 is steadily supplied with Vhold by turning PG-3 OFF and enabling digital LDO/clamp-4 during retentive sleep. In such an embodiment, energy is saved when first power supply VCC is considerably larger than Vhold. In one embodiment, Bit-cell Array 304 is power-gated during destructive sleep mode i.e., both PG-3 and digital LDO/clamp-4 are turned OFF. In one embodiment, during active modes (with frequent read and/or write access), PG-1 switch is turned ON, and CP/CRP 201 generates the boosted third power supply (VCCboost). In one embodiment, boosted third power supply (VCCboost) is not generated when VCC is high because it may cause device reliability issues.

In one embodiment, third power supply (VCCboost) is de-coupled from first power supply node (VCC) by driving the gate terminal of the p-type device Mx-2 with a boosted control signal. Upon entering a low-power retention mode, the embodiment does not only minimize leakage power by power-gating all peripheral circuits (e.g., RF Peripherals 302 and Bit-cell Array 304 in case of destructive sleep), but also recovers a maximum amount of charge from their respective power distribution networks. In such an embodiment, CP/CRP 201 is not immediately stopped after entering a sleep mode, but is still enabled for a few additional cycles in order to recover charge from $C_{nonret}$ and $C_{ret}$ capacitors and supply that recovered charge to the first power supply node VCC (or, eventually, to the leaking bit-cells in the case of retentive sleep).

In one embodiment, Mds-6 enables charge recovery from $C_{ret}$ in case of entering a destructive sleep state. In one embodiment, during the transition phase (i.e., while entering a sleep mode), second power supply (VCCgated) is ramped down as quickly as possible to VCC/2 by CP/CRP 201 to minimize the amount of charge which leaks away through the peripheral circuits (e.g., RF Peripheral 302).

In one embodiment, during this transition phase, CP/CRP 201 is used to recover charge (instead of primarily providing a boosted voltage). In one embodiment, Mx-2 serves a number of purposes. In one embodiment, Mx-2 is used to short the third power supply node (VCCboost) to the first power supply node (VCC) in case of operating at high (e.g., nominal) first power supply (VCC). In such an embodiment, voltage boosting should be avoided in order to maintain high gate oxide and junction reliability of the thin-oxide core devices. One technical effect of this embodiment is that it enables reliable operation for a wide range of voltages, from nominal first power supply (VCC) to VccMin, thereby supporting dynamic voltage and frequency scaling (DVFS) used in many modern SoCs (System on Chips).

In one embodiment, Mx-2 is used to ensure that charge stored on the power distribution network of third power supply node (VCCboost) does not leak away through WWL and RWL drivers 303 via PG-5 and the level shifters 306, but is returned to the first supply node (VCC) by charge sharing between the small capacitor $C_{boost}$ and the large capacitor $C_{SoC}$. In such an embodiment, Mx-2 is turned ON and PG-5 is turned OFF that couple the third power supply node (VCCboost) to the first power supply node (VCC). For example, when entering retention mode, Mx-2 is turned ON and PG-5 is turned OFF.

In one embodiment, Mx-2 allows CP/CRP 201 to serve the double purpose of voltage boosting and charge recovery. In such an embodiment, additional power line interconnection networks may not be needed. For example, by turning OFF Mx-2 and turning ON PG-1 and PG-5, CP/CRP1 can be used for boosting voltage of third power supply node (VCCboost) using second power supply (VCCgated) as input. In another example, by turning ON Mx-2 and turning OFF PG-5 and PG-1, CP/CRP 201 can be used to recover charge from second power supply node (VCCgated) and provide it to the first power supply node (VCC). In one embodiment, after a completed active-to-sleep transition, third power supply node (VCCboost) is coupled to the first power supply node (VCC). In such an embodiment, PG-5 is used to power-gate WWL and RWL drivers 303.

In one embodiment, during an active-to-sleep transition, Mx-2 is turned ON during charge recovery, and turned OFF after charge recovery to power gate WWL and RWL drivers 303. In such an embodiment, PG-5 may be avoided. In one embodiment, a logic circuit is used to provide timing control to PG-5 compared to the case of leaving Mx-2 turned ON and PG-5 turned OFF during the entire sleep period.

Figure 4:
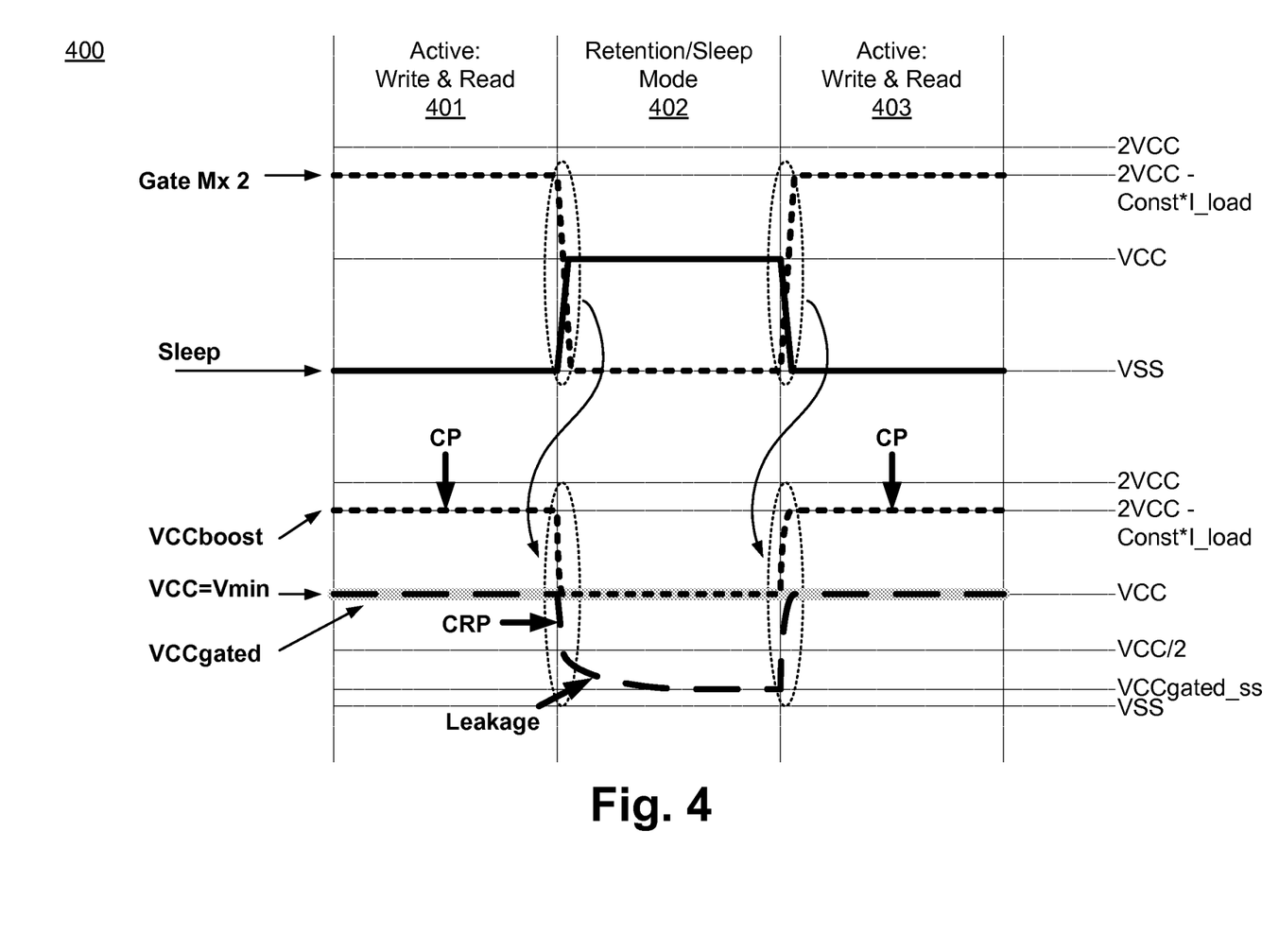
FIG. 4 illustrates a timing diagram showing operation of the power delivery network with CRP circuit of FIG. 3, according to one embodiment of the disclosure.

FIG. 4 illustrates a timing diagram 400 showing operation of power delivery network with CRP circuit for use in a volatile memory system, according to one embodiment of the disclosure. It is pointed out that those elements of FIG. 4 having the same reference numbers (or names) as the elements of any other figure can operate or function in any manner similar to that described, but are not limited to such.

Timing diagram 400 shows three regions—Active Write and Read region 401, Retention Sleep Mode region 402, and Active Write and Read region 403. Here, x-axis is time and y-axis for each waveform is voltage. The voltage levels are indicated to the left. The first waveform from the top is gate voltage to Mx-2. The second voltage is the Sleep signal applied to the gate of PG-1. The third waveform from the top is third power supply (VCCboost). The fourth waveform from the top is the fourth power supply (VCC) when it is at VccMin level. The fifth waveform from the top is the second power supply (VCCgated).

During region 401, Mx-2 is turned OFF to de-couple first power supply node (VCC) from third power supply node (VCCboost). In this region, PG-1 is turned ON which couples the first power supply node (VCC) to the second power supply node (VCCgated). In this embodiment, CP/CRP 201 operates as a charge pump to boost the voltage on the third power supply node (VCCboost). For example, third power supply (VCCboost) is boosted to 2VCC level.

During region 402, Mx-2 is turned ON to couple the first power supply node (VCC) with the third power supply node (VCCboost). In this region, PG-1 is turned OFF (i.e., in sleep mode). In this embodiment, CP/CRP 201 operates as a charge recovery pump to transfer/recover charge from the second power supply node (VCCgated) to the third power supply node (VCCboost) and then to the first power supply node (VCC) through Mx-2. In this embodiment, PG-5 is turned OFF. In one embodiment, CP/CRP 201 comprises a voltage doubler which operates till voltage on second power supply node (VCCgated) reaches VCC/2 and is then turned OFF. In one embodiment, CP/CRP 201 comprises a voltage tripler combined with a voltage doubler. In other embodiments, other implementations of CP/CRP 201 may be used. The remaining charge on the second power supply node (VCCgated) leaks over time to VSS level. During region 403, the events of region 401 are repeated and CP/CRP 201 operates as a charge pump boosting the third power supply node (VCCboost).

Some embodiments of CP/CRP 201 are described in a co-owned PCT Patent Application No. PCT/US2013/077277 titled APPARATUS FOR CHARGE RECOVERY DURING LOW POWER MODE, and filed Dec. 20, 2013.

Table 1 illustrates the various modes of operation and also indicates which devices are turned ON or OFF in those modes.

| Mode | CP/CRP (boost/recovery) | PG-1 | Mx-2 | PG-3 | LDO-4 | PG-5 | Mds-6 |
|---|---|---|---|---|---|---|---|
| Active, high VCC (e.g., nominal VCC) | Disable | ON | ON | ON | ON/OFF | ON | ON/OFF |
| Active, low VCC (e.g., VccMin) | Enable (to boost WWL and RWL) | ON | OFF | ON | ON/OFF | ON | ON/OFF |
| Retentive Sleep Vccarray = VCC (e.g., if Vcc = VccMin, and Vhold being slightly smaller than VccMin) | Enable charge recovery from $C_{nonret}$ | OFF | ON | ON | ON/OFF | OFF | OFF |

-continued

| Mode | CP/CRP (boost/recovery) | PG-1 | Mx-2 | PG-3 | LDO-4 | PG-5 | Mds-6 |
|---|---|---|---|---|---|---|---|
| Retentive Sleep, Vccarray = Vhold | Disable after CR | OFF | ON | OFF | ON | OFF | OFF |
| Destructive Sleep | Enable charge recovery from $C_{nonret}$ and $C_{ret}$ | OFF | ON | OFF | OFF | OFF | ON |
|  | Disable after CR | OFF | ON | OFF | OFF | OFF | ON |

Figure 5:
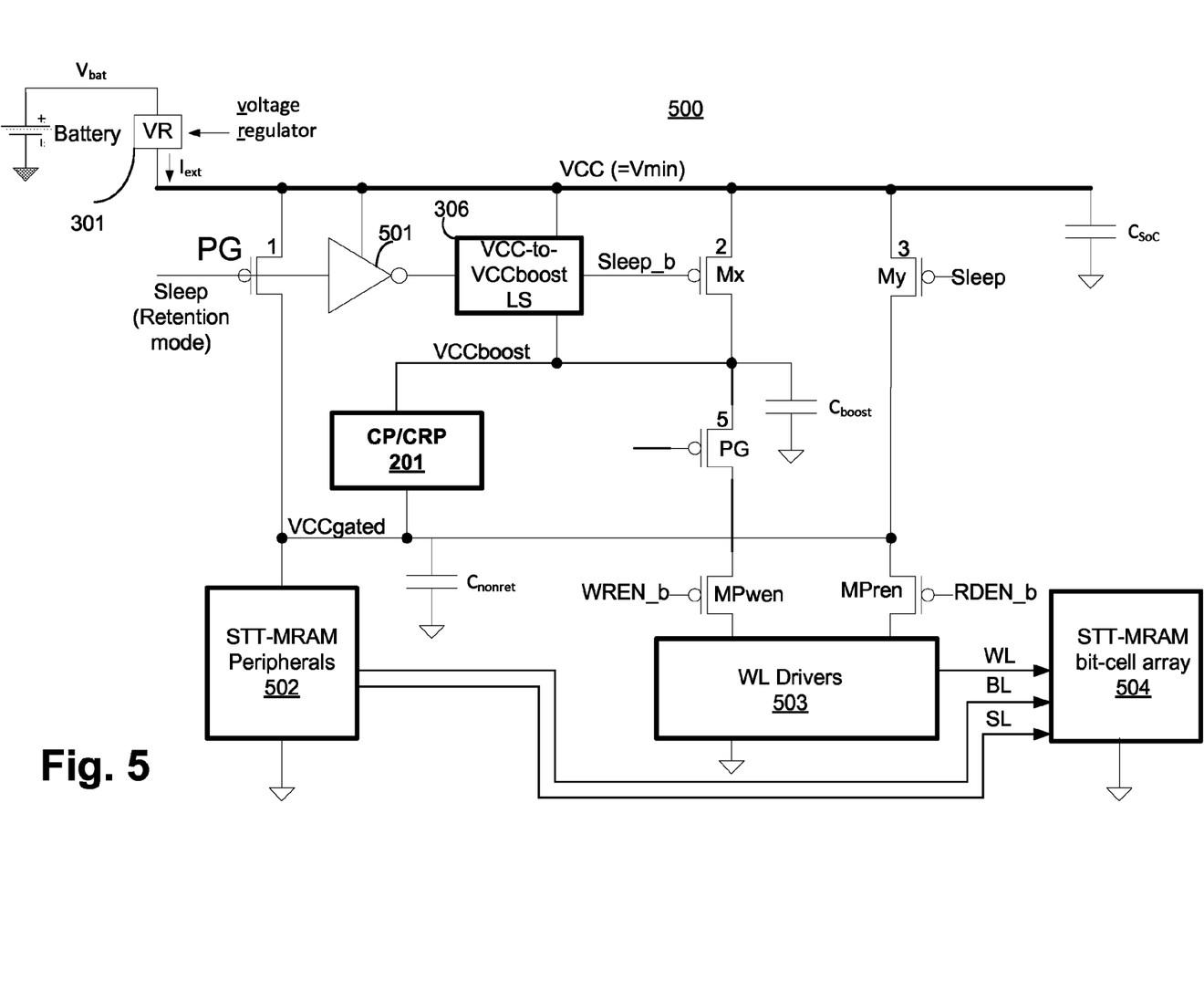
FIG. 5 illustrates a power delivery network with CRP circuit for use in a non-volatile memory system, according to one embodiment of the disclosure.

FIG. 5 illustrates a power delivery network 500 with CRP circuit for use in a non-volatile memory system, according to one embodiment of the disclosure. It is pointed out that those elements of FIG. 5 having the same reference numbers (or names) as the elements of any other figure can operate or function in any manner similar to that described, but are not limited to such. FIG. 5 is described with reference to FIG. 3.

In one embodiment, power delivery network 500 comprises VR 301, input supply source (e.g., Battery), CP/CRP 201, inverter 501, STT-MRAM (Spin Transfer Torque Magnetic Random Access Memory) peripherals 502, WL drivers 503, STT-MRAM bit-cell array 504, VCC-to-VCCboost LS 306, p-type devices PG-1 (i.e., power gate), Mx-2, My-3, and PG-5.

In one embodiment, STT-MRAM bit-cell array 504 is the non-volatile memory which receives control signals from STT-MRAM peripherals 502 and WL drivers 503. These control signals include wordline (WL), bitline (BL), and select line (SL). In one embodiment, during normal active mode PG-1 and My-3 are turned ON which couples first supply node (VCC) to second power supply node (VCCgated). In one embodiment, during write mode, MPwen is turned ON by WREN_b (which is an inverse of write enable signal) while MPren is turned OFF, and WL driver 503 receives boosted voltage generated by CP/CRP 201. In such an embodiment, PG-5 is turned ON and Mx-2 is turned OFF. Here, second power supply node (VCCgated) is provided to STT-MRAM peripherals 502 that generate SL and BL control signals for STT-MRAM bit-cell array 504. In one embodiment, during read operation, MPwen is turned OFF by WREN_b while MPren is turned ON by RDEN_b (which is an inverse of read enable signal).

In one embodiment, during sleep mode (or low power/retention mode), PG-1, My-3, and PG-5 are turned OFF and Mx-2 is turned ON. As discussed with reference to FIG. 3, CP/CRP 201 then begins to operate in charge recovery mode and recovers charge from second power supply node (VCCgated) and transfers it to the first power supply node (VCC). In such an embodiment, MPwen and MPren are turned OFF.

Figure 6:
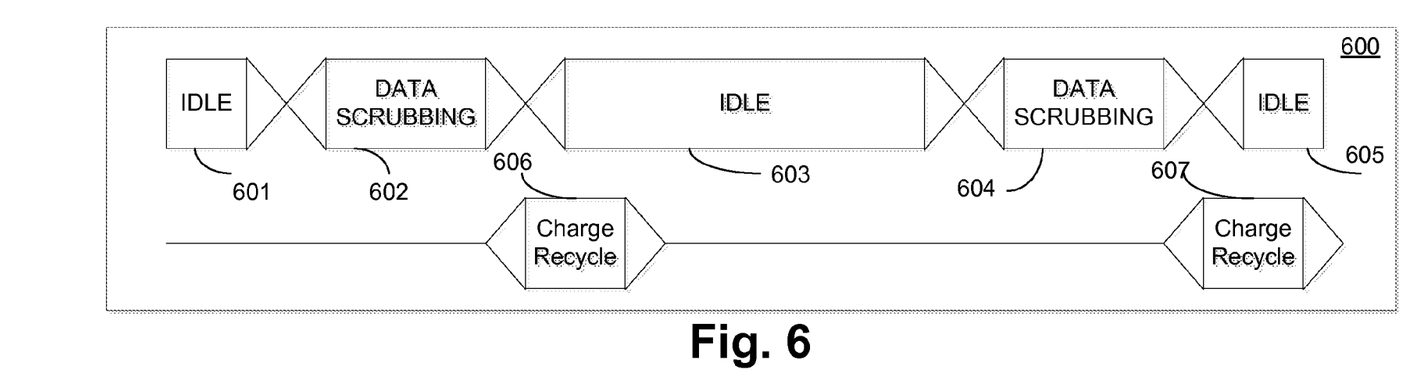
FIG. 6 illustrates a timing diagram for periodic charge recovery for an STT-MRAM (Spin Transfer Torque Magnetic Random Access Memory) system, according to one embodiment of the disclosure.

FIG. 6 illustrates a timing diagram 600 for periodic charge recovery for a STT-MRAM system, according to one embodiment of the disclosure. It is pointed out that those elements of FIG. 6 having the same reference numbers (or names) as the elements of any other figure can operate or function in any manner similar to that described, but are not limited to such.

Here, the x-axis is time. The frames show periodic data scrubbing events. The first event 601 is an idle event. The second event 602 is the active mode in which regular power supply is provided to the STT-MRAM system and data in the STT-MRAM (e.g., array 504 of FIG. 5) is scrubbed to retain it. The third event 603 is idle mode. The idle state may last for one second, for example. During idle state, all previously high nodes leak voltage to ground. The fourth event 604 is a scrubbing event followed by fifth event which is an idle event 605, and so on.

In one embodiment, after every data scrubbing event, charge recycling is initiated to recover charge being otherwise lost during idle time. For example, after second event 602, charge recycling 606 is activated by CRP of the embodiments which recovers charge from one or more of the power supply nodes which were previously at high voltage. After fourth event 604, charge recycling 607 is activated by CRP of the embodiments which recovers charge from one or more of the power supply nodes which were previously at high voltage. In one embodiment, cost of scrubbing STT-MRAM is reduced because global VCC is charged up using the CRP. In such an embodiment, CRP of the embodiments allows the STT-MRAM system to conduct more scrubbing events to help optimize bit cell to lower write power.

Figure 7:
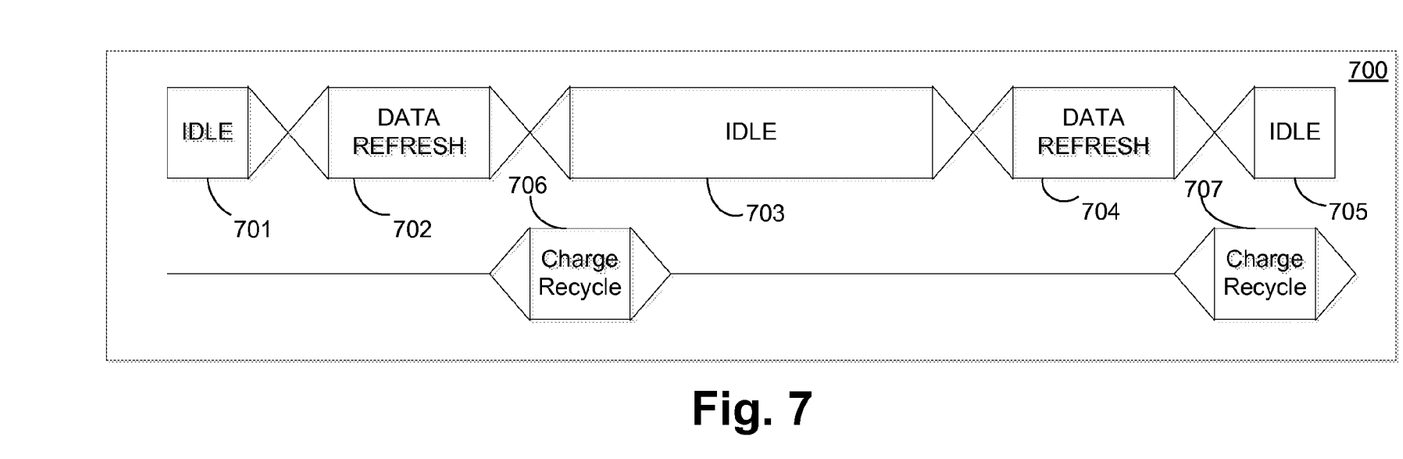
FIG. 7 illustrates a timing diagram for periodic charge recovery for a DRAM (Dynamic Random Access Memory) system, according to one embodiment of the disclosure.

FIG. 7 illustrates a timing diagram 700 for periodic charge recovery for a DRAM system, according to one embodiment of the disclosure. It is pointed out that those elements of FIG. 7 having the same reference numbers (or names) as the elements of any other figure can operate or function in any manner similar to that described, but are not limited to such.

Here, the x-axis is time. The frames show periodic data refreshing events. The first event 701 is an idle event. The second event 702 is the active mode in which regular power supply is provided to the DRAM system and data in the DRAM is refreshed to retain it. The third event 703 is idle mode. The idle state may last for hundreds of microseconds, for example. During idle state, all previously high nodes are leaking. The fourth event 704 is a refresh event followed by fifth event which is an idle event 705, and so on.

In one embodiment, after every data refresh event, charge recycling is initiated to recover charge being otherwise lost during idle time. For example, after second event 702, charge recycling 706 is activated by CRP of the embodiments which recovers charge from one or more of the power supply nodes which were previously at high voltage. After fourth event 704, charge recycling 707 is activated by CRP of the embodiments which recovers charge from one or more of the power supply nodes which were previously at high voltage. In one embodiment, cost of refreshing DRAM is reduced because global VCC is charged up using the CRP. In such an embodiment, CRP of the embodiments allows the DRAM system to conduct more refreshing events to help optimize bit cell to lower write power.

Figure 8:
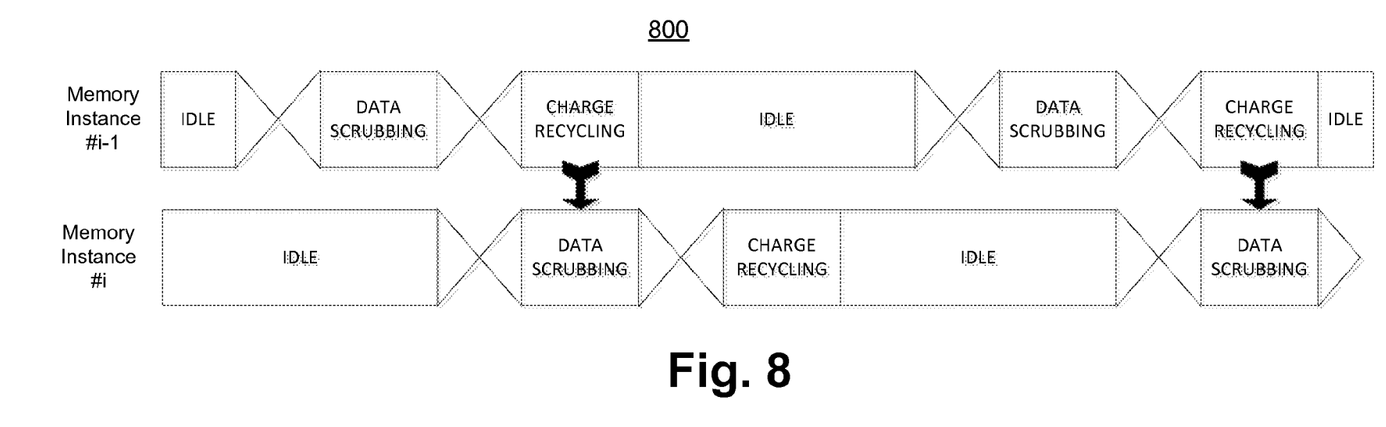
FIG. 8 illustrates a timing diagram for periodic charge recovery for an STT-MRAM system data in which scrubbing of the different memory instances is done at different times, according to one embodiment of the disclosure.

FIG. 8 illustrates a timing diagram 800 for periodic charge recovery for an STT-MRAM system data in which scrubbing of the different memory instances is done at different times, according to one embodiment of the disclosure.

An SoC may comprise several memory instances. Timing diagram 800 illustrates two such instances "i–1" and 'i,' where 'i' is an integer. In this embodiment, the memories are STT-RAMs. Each memory instance operates in cycles of scrubbing (i.e., active mode) and idling (i.e., sleep mode). In one embodiment, to ensure recycled charges are optimally used, data scrubbing of the different memory instances is performed at different times, so that charge recycling taking place into one memory instance may partially power data scrubbing taking place into another memory instance. For example, when memory instance "i−1" is recycling charge using its CP/CRP, then that recovered charge is used during scrubbing or other active mode operations of memory instance 'i.' In such an embodiment, current peaks due to too many concurrent data scrubbing can be avoided.

Figure 9:
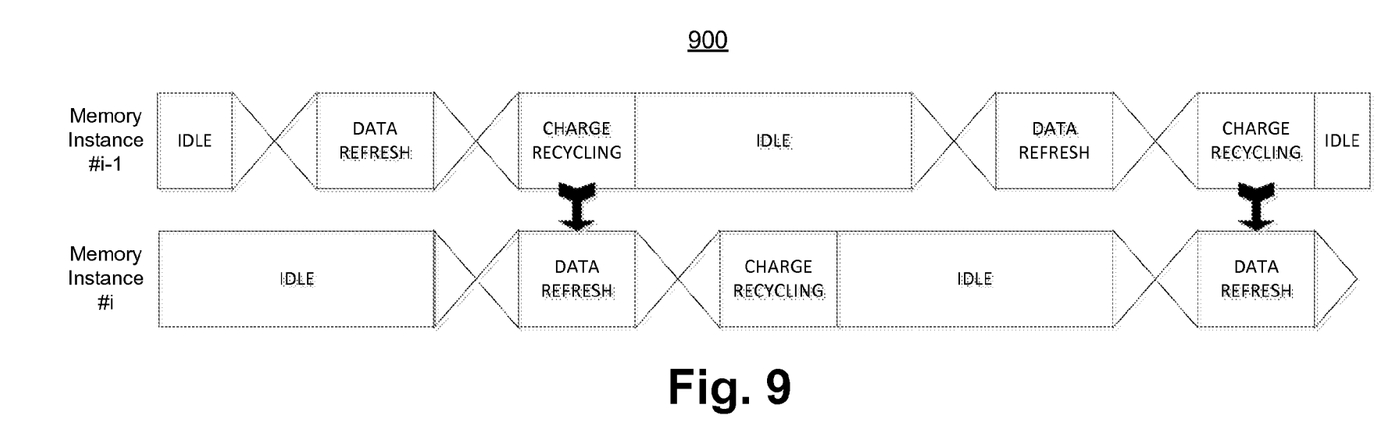
FIG. 9 illustrates a timing diagram for periodic charge recovery for a DRAM system data in which data refreshing of the different memory instances is done at different times, according to one embodiment of the disclosure.

FIG. 9 illustrates a timing diagram 900 for periodic charge recovery for a DRAM system data in which data refreshing of the different memory instances is done at different times, according to one embodiment of the disclosure.

Timing diagram 900 is similar to timing diagram 800, but explained with reference to a DRAM. Timing diagram 900 illustrates two such instances "i−1" and 'i,' where 'i' is an integer. In this embodiment, the memories are DRAMs. Each memory instance operates in cycles of refreshing (i.e., active mode) and idling (i.e., sleep mode). In one embodiment, to ensure recycled charges are optimally used, data refreshing of the different memory instances is performed at different times, so that charge recycling taking place into one memory instance may partially power data refreshing taking place into another memory instance. For example, when memory instance "i−1" is recycling charge using its CP/CRP, then that recovered charge is used during refreshing or other active mode operations of memory instance 'i.' In such an embodiment, current peaks due to too many concurrent data refreshing can be avoided.

The application of CRP is not limited to the embodiments discussed above. For example, CRP can be used in wireless mobile devices/modems or power stations. Wireless modems periodically wake-up from a low power state for network synchronization. If there is energy available, it tries to receive that energy. For example, GSM mobile devices have paging modes every 1-2 seconds. After the wireless modem leaves the wake-up state and enters a low power mode in which power supply to some power distribution networks is cut off, CRP can be enabled to recover charge from the recently used power distribution network before the charge on that network leaks away to ground.

In one embodiment, sniffer circuits may be used to sense change in power environment. That information can be used to enable/disable CRP to recover charge from power distribution networks that were previously providing power but now are in low power mode and leaking their power away to ground. In such an embodiment, CRP can recover charge that would otherwise be lost. This recovered charge can be used for any purpose. In a general sense, CRP of the embodiments can be used to recover charge from any electronic device that regularly transitions between low power mode (e.g., sleep mode) and active power.

In one embodiment, CP/CRP (e.g., CP/CRP 201) includes a voltage regulation stage. In such an embodiment, when CP/CRP operates in CP mode (e.g., for voltage boosting), the regulation stage is enabled so that the boosted voltage output is a regulated output. In one embodiment, when CP/CRP operates in CR mode (e.g., to recover charge from one capacitive power distribution node to another capacitive power distribution node), the output regulation stage of CP/CRP is bypassed because CP/CRP is not generating a regulated output but recovering charge.

Figure 10:
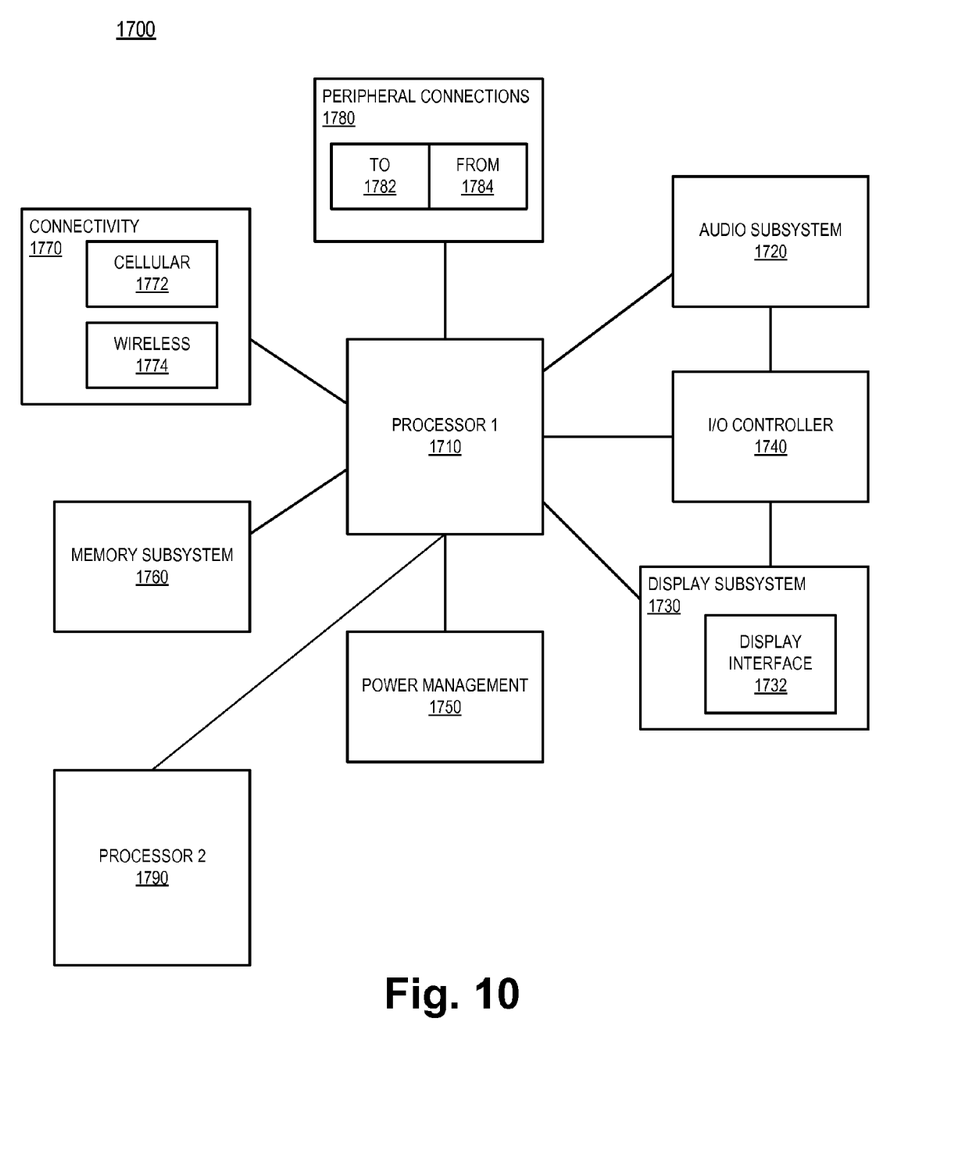
FIG. 10 is a smart device or a computer system or an SoC (System-on-Chip) with CRP apparatus, according to one embodiment of the disclosure.

FIG. 10 is a smart device or a computer system or an SoC (System-on-Chip) with CRP apparatus, according to one embodiment of the disclosure. It is pointed out that those elements of FIG. 10 having the same reference numbers (or names) as the elements of any other figure can operate or function in any manner similar to that described, but are not limited to such.

FIG. 10 illustrates a block diagram of an embodiment of a mobile device in which flat surface interface connectors could be used. In one embodiment, computing device 1700 represents a mobile computing device, such as a computing tablet, a mobile phone or smart-phone, a wireless-enabled e-reader, or other wireless mobile device. It will be understood that certain components are shown generally, and not all components of such a device are shown in computing device 1700.

In one embodiment, computing device 1700 includes a first processor 1710 with CRP apparatus described with reference to embodiments discussed. Other blocks of the computing device 1700 may also include power-gating scheme having CRP apparatus described with reference to embodiments discussed. The various embodiments of the present disclosure may also comprise a network interface within 1770 such as a wireless interface so that a system embodiment may be incorporated into a wireless device, for example, cell phone or personal digital assistant.

In one embodiment, processor 1710 (and processor 1790) can include one or more physical devices, such as microprocessors, application processors, microcontrollers, programmable logic devices, or other processing means. The processing operations performed by processor 1710 include the execution of an operating platform or operating system on which applications and/or device functions are executed. The processing operations include operations related to I/O (input/output) with a human user or with other devices, operations related to power management, and/or operations related to connecting the computing device 1700 to another device. The processing operations may also include operations related to audio I/O and/or display I/O.

In one embodiment, computing device 1700 includes audio subsystem 1720, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 1700, or connected to the computing device 1700. In one embodiment, a user interacts with the computing device 1700 by providing audio commands that are received and processed by processor 1710.

Display subsystem 1730 represents hardware (e.g., display devices) and software (e.g., drivers) components that provide a visual and/or tactile display for a user to interact with the computing device 1700. Display subsystem 1730 includes display interface 1732, which includes the particular screen or hardware device used to provide a display to a user. In one embodiment, display interface 1732 includes logic separate from processor 1710 to perform at least some processing related to the display. In one embodiment, display subsystem 1730 includes a touch screen (or touch pad) device that provides both output and input to a user.

I/O controller 1740 represents hardware devices and software components related to interaction with a user. I/O controller 1740 is operable to manage hardware that is part of audio subsystem 1720 and/or display subsystem 1730. Additionally, I/O controller 1740 illustrates a connection point for additional devices that connect to computing device 1700 through which a user might interact with the system. For example, devices that can be attached to the computing device 1700 might include microphone devices, speaker or stereo systems, video systems or other display devices, keyboard or keypad devices, or other I/O devices for use with specific applications such as card readers or other devices.

As mentioned above, I/O controller 1740 can interact with audio subsystem 1720 and/or display subsystem 1730. For example, input through a microphone or other audio device can provide input or commands for one or more applications or functions of the computing device 1700. Additionally, audio output can be provided instead of, or in addition to display output. In another example, if display subsystem 1730 includes a touch screen, the display device also acts as an input device, which can be at least partially managed by I/O controller 1740. There can also be additional buttons or switches on the computing device 1700 to provide I/O functions managed by I/O controller 1740.

In one embodiment, I/O controller 1740 manages devices such as accelerometers, cameras, light sensors or other environmental sensors, or other hardware that can be included in the computing device 1700. The input can be part of direct user interaction, as well as providing environmental input to the system to influence its operations (such as filtering for noise, adjusting displays for brightness detection, applying a flash for a camera, or other features).

In one embodiment, computing device 1700 includes power management 1750 that manages battery power usage, charging of the battery, and features related to power saving operation. Memory subsystem 1760 includes memory devices for storing information in computing device 1700. Memory can include nonvolatile (state does not change if power to the memory device is interrupted) and/or volatile (state is indeterminate if power to the memory device is interrupted) memory devices. Memory subsystem 1760 can store application data, user data, music, photos, documents, or other data, as well as system data (whether long-term or temporary) related to the execution of the applications and functions of the computing device 1700.

Elements of embodiments are also provided as a machine-readable medium (e.g., memory 1760) for storing the computer-executable instructions (e.g., instructions to implement any other processes discussed herein). The machine-readable medium (e.g., memory 1760) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity 1770 includes hardware devices (e.g., wireless and/or wired connectors and communication hardware) and software components (e.g., drivers, protocol stacks) to enable the computing device 1700 to communicate with external devices. The computing device 1700 could be separate devices, such as other computing devices, wireless access points or base stations, as well as peripherals such as headsets, printers, or other devices.

Connectivity 1770 can include multiple different types of connectivity. To generalize, the computing device 1700 is illustrated with cellular connectivity 1772 and wireless connectivity 1774. Cellular connectivity 1772 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 1774 refers to wireless connectivity that is not cellular, and can include personal area networks (such as Bluetooth, Near Field, etc.), local area networks (such as Wi-Fi), and/or wide area networks (such as WiMax), or other wireless communication.

Peripheral connections 1780 include hardware interfaces and connectors, as well as software components (e.g., drivers, protocol stacks) to make peripheral connections. It will be understood that the computing device 1700 could both be a peripheral device ("to" 1782) to other computing devices, as well as have peripheral devices ("from" 1784) connected to it. The computing device 1700 commonly has a "docking" connector to connect to other computing devices for purposes such as managing (e.g., downloading and/or uploading, changing, synchronizing) content on computing device 1700. Additionally, a docking connector can allow computing device 1700 to connect to certain peripherals that allow the computing device 1700 to control content output, for example, to audiovisual or other systems.

In addition to a proprietary docking connector or other proprietary connection hardware, the computing device 1700 can make peripheral connections 1780 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. For example, other memory architectures e.g., Dynamic RAM (DRAM) may use the embodiments discussed. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

For example, an apparatus is provided which comprises: a first power supply node to provide a first power supply, a second power supply node, and a third power supply node; a first transistor which is operable to couple the first and second power supply nodes; and a charge pump circuit to provide a boosted voltage to the third power supply node in one mode, and to recover charge from the second power node in another mode.

In one embodiment, the apparatus further comprises a second transistor which is operable to couple the third power supply node to the first power supply node. In one embodiment, the apparatus further comprises a third transistor which is operable to couple the first power supply node to a fourth power supply node. In one embodiment, the apparatus further comprises a memory array coupled to the fourth power supply node. In one embodiment, the apparatus further comprises a fourth transistor coupled in parallel to the third transistor, wherein the fourth transistor is operable to couple the fourth power supply node to the first power supply node.

In one embodiment, the apparatus further comprises a fifth transistor which is operable to provide the boosted voltage to one or more drivers. In one embodiment, the one or more drivers include write wordline drivers and read wordline drivers. In one embodiment, the apparatus further comprises memory peripheral circuits to receive power from the second power supply node. In one embodiment, the apparatus further comprises a voltage regulator to provide the first power supply to the first power supply node.

In another example, an apparatus is provided which comprises a DRAM (Dynamic Random Access Memory) which is operable to be refreshed; a first power supply node coupled to the DRAM to provide a first power supply to the DRAM; and a charge recycling circuit to recover charge from the first power supply node after the DRAM is refreshed. In one embodiment, the apparatus comprises a second power supply node to receive the recovered charge from the charge recycling circuit. In one embodiment, the apparatus further comprises logic to periodically activate the charge recycling circuit.

In another example, an apparatus is provided which comprises: an STT-MRAM which is operable to be scrubbed; one or more drivers coupled to the STT-MRAM; a first power supply node coupled to the one or more drivers to provide a first power supply to the one or more drivers; and a charge recycling circuit to recover charge from the first power supply node after the STT-MRAM is scrubbed.

In one embodiment, the apparatus further comprises a second power supply node to receive the recovered charge from the charge recycling circuit. In one embodiment, the apparatus further comprises logic to periodically activate the charge recycling circuit.

In another example, a system is provided which comprises: a memory unit; a processor coupled to the memory unit, the processor having an apparatus which comprises: a first power supply node to provide a first power supply, a second power supply node, and a third power supply node; a first transistor which is operable to couple the first and second power supply nodes; and a charge pump circuit to provide a boosted voltage to the third power supply node in one mode, and to recover charge from the second power node in another mode; and a wireless interface for allowing the processor to communicate with another device.

In one embodiment, the memory unit comprises: an STT-MRAM which is operable to be scrubbed; one or more drivers coupled to the STT-MRAM; a gated power supply node coupled to the one or more drivers to provide a gated power supply to the one or more drivers; and a charge recycling circuit to recover charge from the gated power supply node after the STT-MRAM is scrubbed. In one embodiment, the system further comprises logic to periodically activate the charge recycling circuit. In one embodiment, the memory unit comprises: a DRAM which is operable to be refreshed; a gated power supply node coupled to the DRAM to provide a gated power supply to the DRAM; and a charge recycling circuit to recover charge from the gated power supply node after the DRAM is refreshed. In one embodiment, the system further comprises: a voltage regulator to provide the first power supply to the first power supply node.

In another example, a wireless device is provided which comprises: an antenna; a processor coupled to the antenna; and a first power supply node to provide a first power supply to the logic unit, wherein the processor includes: a logic unit to wake-up the processor from a low power state and to cause the processor to detect any incoming signal at the antenna; and a charge recycling circuit to recover charge from the first power supply node after the logic unit causes the processor to enter the low power state. In one embodiment, the logic unit is operable to wake-up the processor periodically. In one embodiment, the charge recycling circuit is operable to recover charge from the first power supply node periodically. In one embodiment, the wireless device a second power supply node, wherein the charge recycling circuit to recover charge from the first power supply node and provide it to the second power supply node.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An apparatus comprising:
   a first power supply node to provide a first power supply, a second power supply node, and a third power supply node;
   a first transistor which is operable to couple the first and second power supply nodes;
   a charge pump circuit to provide a boosted voltage to the third power supply node in one mode, and to recover charge from the second power node in another mode; and
   memory peripheral circuits to receive power from the second power supply node.

2. The apparatus of claim 1 further comprises a second transistor which is operable to couple the third power supply node to the first power supply node.

3. The apparatus of claim 2 further comprises a third transistor which is operable to couple the first power supply node to a fourth power supply node.

4. The apparatus of claim 3 further comprises a memory array coupled to the fourth power supply node.

5. The apparatus of claim 3 further comprises a fourth transistor coupled in parallel to the third transistor, wherein the fourth transistor is operable to couple the fourth power supply node to the first power supply node.

6. The apparatus of claim 5 further comprises a fifth transistor which is operable to provide the boosted voltage to one or more drivers.

7. The apparatus of claim 6, wherein the one or more drivers include write wordline drivers and read wordline drivers.

8. The apparatus of claim 1 further comprises a voltage regulator to provide the first power supply to the first power supply node.

9. An apparatus comprising:
a DRAM which is operable to be refreshed;
a first power supply node coupled to the DRAM to provide a first power supply to the DRAM;
a transistor coupled between a second power supply node and the first supply node to enable charge recovery from the second supply node; and
a charge recycling circuit to recover charge from the first second power supply node after the DRAM is refreshed and supplying the recovered charge to the first power supply node.

10. The apparatus of claim 9 further comprises a capacitive device coupled to the second power supply node through the transistor.

11. The apparatus of claim 9 further comprises logic to periodically activate the charge recycling circuit.

12. An apparatus comprising:
an STT-MRAM which is operable to be scrubbed;
one or more drivers coupled to the STT-MRAM;
a first power supply node coupled to the one or more drivers to provide a first power supply to the one or more drivers; and
a charge recycling circuit to recover charge from a second power supply node after the STT-MRAM is scrubbed and supplying the recovered charge to the first power supply node.

13. The apparatus of claim 12 further comprises a capacitive device coupled to the second power supply node.

14. The apparatus of claim 12 further comprises logic to periodically activate the charge recycling circuit.

15. A system comprising:
a memory unit;
a processor coupled to the memory unit, the processor having an apparatus which comprises:
a first power supply node to provide a first power supply, a second power supply node, and a third power supply node;
a first transistor which is operable to couple the first and second power supply nodes;
a charge pump circuit to provide a boosted voltage to the third power supply node in one mode, and to recover charge from the second power node in another mode; and
memory peripheral circuits to receive power from the second power supply node; and
a wireless interface for allowing the processor to communicate with another device.

16. The system of claim 15, wherein the memory unit comprises:
an STT-MRAM which is operable to be scrubbed;
one or more drivers coupled to the STT-MRAM;
a power supply node coupled to the one or more drivers to provide a power supply to the one or more drivers; and
a charge recycling circuit to recover charge from a gated power supply node after the STT-MRAM is scrubbed and supplying the recovered charge to the power supply node.

17. The system of claim 16 further comprises a logic unit to periodically activate the charge recycling circuit.

18. The system of claim 15, wherein the memory unit comprises:
a DRAM which is operable to be refreshed;
a power supply node coupled to the DRAM to provide a power supply to the DRAM;
a transistor coupled between a gated power supply node and the power supply node to enable charge recovery from the gated power supply node; and
a charge recycling circuit to recover charge from the gated power supply node after the DRAM is refreshed and supplying the recovered charge to the power supply node.

19. The system of claim 15 further comprises a voltage regulator to provide the first power supply to the first power supply node.

* * * * *